(12) United States Patent
Omi et al.

(10) Patent No.: US 11,631,590 B2
(45) Date of Patent: Apr. 18, 2023

(54) SUBSTRATE PROCESSING METHOD, SUBSTRATE PROCESSING APPARATUS AND CLEANING APPARATUS

(71) Applicant: Tokyo Electron Limited, Tokyo (JP)

(72) Inventors: Muneyuki Omi, Miyagi (JP); Taku Gohira, Miyagi (JP); Takahiro Murakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/944,546

(22) Filed: Jul. 31, 2020

(65) Prior Publication Data
US 2021/0035814 A1 Feb. 4, 2021

(30) Foreign Application Priority Data

Aug. 2, 2019 (JP) .............................. JP2019-143058

(51) Int. Cl.
| | |
|---|---|
| *H01L 21/311* | (2006.01) |
| *H01L 21/67* | (2006.01) |
| *H01L 21/02* | (2006.01) |
| *H01J 37/32* | (2006.01) |
| *B08B 7/04* | (2006.01) |
| *B08B 13/00* | (2006.01) |

(52) U.S. Cl.
CPC .......... *H01L 21/31116* (2013.01); *B08B 7/04* (2013.01); *B08B 13/00* (2013.01); *H01J 37/32724* (2013.01); *H01J 37/32733* (2013.01); *H01L 21/02087* (2013.01); *H01L 21/31144* (2013.01); *H01L 21/67034* (2013.01); *H01L 21/67069* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| 8,435,902 B2 * | 5/2013 | Tang ................. H01L 21/31116 438/723 |
|---|---|---|
| 2006/0189145 A1 * | 8/2006 | Honda .............. H01L 21/02063 438/710 |
| 2017/0117118 A1 * | 4/2017 | Toh ................... H01J 37/32715 |
| 2017/0178922 A1 * | 6/2017 | Takashima ........ H01L 21/31144 |

FOREIGN PATENT DOCUMENTS

| JP | 2000-068257 A | 3/2000 |
|---|---|---|
| JP | 2008-047686 A | 2/2008 |
| JP | 2010-141238 A | 6/2010 |
| JP | 2016-207840 A | 12/2016 |

* cited by examiner

*Primary Examiner* — Stephanie P Duclair
(74) *Attorney, Agent, or Firm* — Pearne & Gordon LLP

(57) ABSTRACT

A substrate processing method includes preparing a substrate including an etching target film and a mask; etching the etching target film through the mask by plasma; and heat-treating the substrate at a preset temperature after the etching of the etching target film.

14 Claims, 8 Drawing Sheets

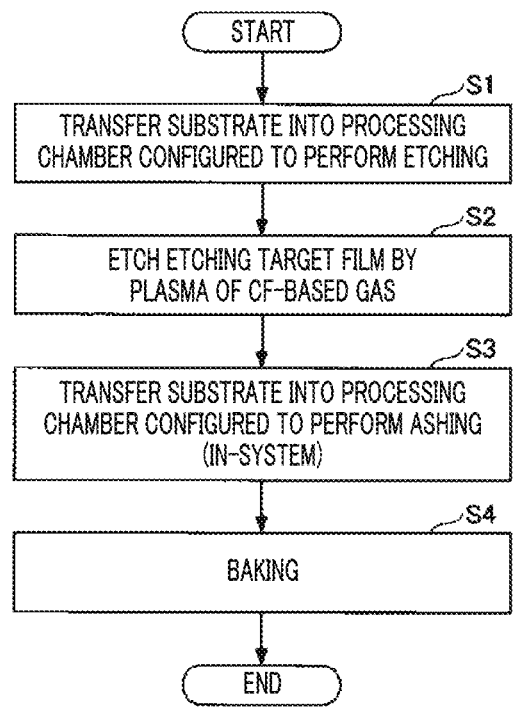

SUBSTRATE PROCESSING METHOD, SUBSTRATE PROCESSING APPARATUS AND CLEANING APPARATUS

CROSS-REFERENCE TO RELATED APPLICATION

This application claims the benefit of Japanese Patent Application No. 2019-143058 filed on Aug. 2, 2019, the entire disclosure of which is incorporated herein by reference.

TECHNICAL FIELD

The various aspects and embodiments described herein pertain generally to a substrate processing method, a substrate processing apparatus and a cleaning apparatus.

BACKGROUND

There is known a method of etching a semiconductor wafer, which has a silicon oxide film and a silicon nitride film stacked on top of each other, in a low temperature environment to form a hole having a high aspect ratio (see, for example, Patent Document 1). When etching an etching target film containing silicon nitride by using a hydrogen-containing gas, a reaction product is generated, and the generated reaction product is deposited on a front surface and a side surface of the etching target film after the etching.

Patent Document 1: Japanese Patent Laid-open Publication No. 2016-207840

SUMMARY

In an exemplary embodiment, a substrate processing method includes preparing a substrate including an etching target film and a mask; etching the etching target film through the mask by plasma; and heat-treating the substrate at a preset temperature after the etching of the etching target film.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is a flowchart illustrating an example of a substrate processing method according to the exemplary embodiment;

FIG. 6 is a diagram illustrating an example of degeneration or deformation temperatures of various materials;

DETAILED DESCRIPTION

Figure 1:
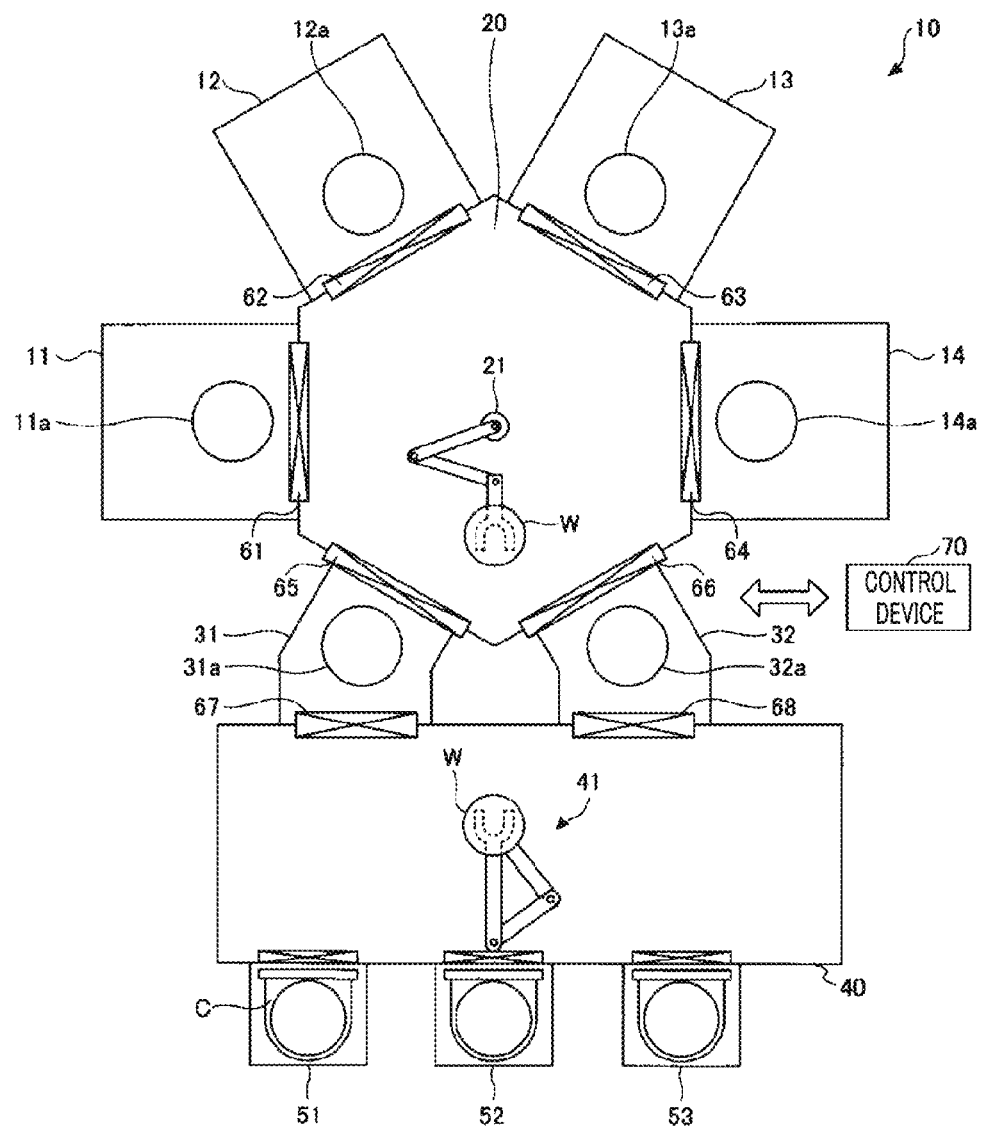
FIG. 1 is a diagram illustrating an example of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same parts will be assigned same reference numerals, and redundant description will be omitted.

[Substrate Processing System]

An example of a substrate processing system 10 according to an exemplary embodiment will be described with reference to FIG. 1. FIG. 1 is a diagram illustrating the example of the substrate processing system 10 according to the exemplary embodiment. The substrate processing system 10 performs a substrate processing method including an etching process and a heat treatment process according to the exemplary embodiment.

The substrate processing system 10 includes processing chambers 11 to 14, a vacuum transfer chamber 20, load lock chambers 31 and 32, an atmospheric transfer chamber 40, load ports 51 to 53, gate valves 61 to 68, and a control device 70.

The processing chamber 11 has a stage 11a configured to place a substrate W thereon, and is connected to the vacuum transfer chamber 20 via the gate valve 61. Likewise, the processing chamber 12 has a stage 12a configured to place the substrate W thereon, and is connected to the vacuum transfer chamber 20 via the gate valve 62. The processing chamber 13 has a stage 13a configured to place the substrate W thereon, and is connected to the vacuum transfer chamber 20 via the gate valve 63. The processing chamber 14 has a stage 14a configured to place the substrate W thereon, and is connected to the vacuum transfer chamber 20 via the gate valve 64. The inside of each of the processing chambers 11 to 14 is decompressed to a preset vacuum atmosphere, and a required processing (an etching processing, a heat treatment, or the like) is performed therein. Further, operations of individual components within the processing chambers 11 to 14 for carrying out the processing are controlled by the control device 70.

The inside of the vacuum transfer chamber 20 is decompressed to a preset vacuum atmosphere. Further, the vacuum transfer chamber 20 is equipped with a transfer device 21. The transfer device 21 transfers substrates to the processing chambers 11 to 14 and the load lock chambers 31 and 32. Further, the operation of the transfer device 21 is controlled by the control device 70.

The load lock chamber 31 has a stage 31a configured to place the substrate thereon, and is connected to the vacuum transfer chamber 20 via the gate valve 65 and also connected to the atmospheric transfer chamber 40 via the gate valve 67. Likewise, the load lock chamber 32 has a stage 32a configured to place the substrate thereon, and is connected to the vacuum transfer chamber 20 via the gate valve 66 and also connected to the atmospheric transfer chamber 40 via the gate valve 68. The inside of each of the load lock chambers 31 and 32 is switchable between an atmospheric atmosphere and a vacuum atmosphere. Furthermore, the switchover between the vacuum atmosphere and the atmospheric atmosphere within the load lock chambers 31 and 32 is controlled by the control device 70.

The inside of the atmospheric transfer chamber 40 is set to be in the atmospheric atmosphere, and a downflow of, for example, clean air is formed therein. Further, the atmospheric transfer chamber 40 is equipped with a transfer device 41. The transfer device 41 transfers the substrates to the load lock chamber 31 and 32 and carriers C of the load ports 51 to 53 to be described later. Further, the operation of the transfer device 41 is controlled by the control device 70.

The load ports 51 to 53 are provided at a wall surface of the atmospheric transfer chamber 40 at a long side. A carrier C accommodating substrates therein or an empty carrier C is mounted to each of the load ports 51 to 53. By way of example, a FOUP (Front Opening Unified Pod) or the like may be used as the carrier C.

The gate valves 61 to 68 are configured to be opened or closed. The opening/closing of the gate valves 61 to 68 are controlled by the control device 70.

The control device 70 controls the entire substrate processing system 10 by controlling the operations of the processing chambers 11 to 14, the operations of the transfer devices 21 and 41, the opening/closing of the gate valves 61 to 68, the switchover into the vacuum atmosphere or the atmospheric atmosphere within the load lock chambers 31 and 32, and so forth.

Now, an example of an operation of the substrate processing system 10 will be discussed. By way of example, the control device 70 opens the gate valve 67, and controls the transfer device 41 to transfer a substrate accommodated in the carrier C of, for example, the load port 51 onto the stage 31a of the load lock chamber 31. The control device 70 then closes the gate valve 67, turning the inside of the load lock chamber 31 into the vacuum atmosphere.

Then, the control device 70 opens the gate valves 61 and 65, and controls the transfer device 21 to transfer the substrate of the load lock chamber 31 onto the stage 11a of the processing chamber 11. The control device 70 closes the gate valves 61 and 65 and operates the processing chamber 11. Accordingly, a preset processing (for example, an etching processing or the like) is performed on the substrate in the processing chamber 11.

Subsequently, the control device 70 opens the gate valves 61 and 63, and controls the transfer device 21 to transfer the substrate processed by the processing chamber 11 onto the stage 13a of the processing chamber 13. The control device 70 closes the gate valves 61 and 63 and operates the processing chamber 13. Accordingly, a preset processing (for example, a heat treatment to be described later or the like) is performed on the substrate in the processing chamber 13.

The control device 70 may transfer the substrate processed by the processing chamber 11 onto the stage 14a of the processing chamber 14 which is configured to perform the same processing as the processing chamber 13. In the present exemplary embodiment, the substrate of the processing chamber 11 is transferred into the processing chamber 13 or the processing chamber 14 depending on an operational status of the processing chamber 13 and the processing chamber 14. Thus, the control device 70 is capable of performing the preset processing (for example, the heat treatment or the like) on a plurality of substrates in parallel by using the processing chamber 13 and the processing chamber 14. Accordingly, productivity can be increased. Likewise, the etching processing may be performed on the plurality of substrates in parallel by using the processing chamber 11 and the processing chamber 12, or the heat treatment may be performed on the plurality of substrates in parallel by using the processing chambers 12, 13 and 14.

The control device 70 controls the transfer device 21 to transfer the substrate processed by the processing chamber 13 or the processing chamber 14 onto the stage 31a of the load lock chamber 31 or the stage 32a of the load lock chamber 32. The control device 70 sets the inside of the load lock chamber 31 or the load lock chamber 32 to be in the atmospheric atmosphere. The control device 70 opens the gate valve 67 or the gate valve 68, and controls the transfer device 41 to carry the substrate of the load lock chamber 32 into the carrier C on, for example, the load port 53 to accommodate the substrate therein.

As stated above, according to the substrate processing system 10 shown in FIG. 1, it is possible to perform the etching processing and the heat treatment on the substrate without exposing the substrate to the atmosphere, that is, without breaking a vacuum while the processings are performed on the substrate by the individual processing chambers.

[Damage Due to Exposure to the Atmosphere]

Figure 2:
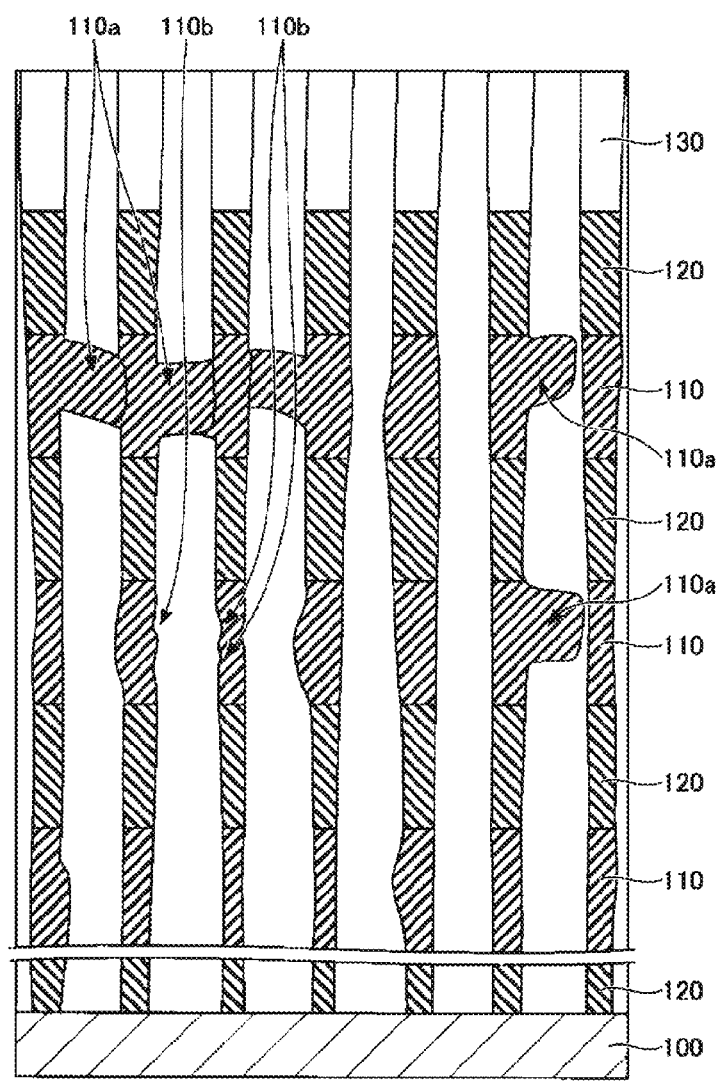
FIG. 2 is a diagram illustrating an example of an etching target film exposed to the atmosphere after an etching process.

FIG. 2 is a diagram illustrating an example of an etching target film exposed to the atmosphere after the etching process. The etching target film of FIG. 2 is a stacked film including silicon nitride films (SiN) 110 and silicon oxide films (SiO$_2$) 120 stacked on top of each other. In the etching process, by etching the stacked film through a mask 130 by using plasma of a CF-based gas, slit-shaped grooves or holes are formed in the stacked film.

If the stacked film including the silicon nitride films 110 and the silicon oxide films 120 are etched by using the plasma of the CF-based gas or plasma of a CHF-based gas, a reaction product of ammonium fluorosilicate (AFS) is generated during the etching process, and this reaction product is deposited on the stacked film. If the substrate is exposed to the atmosphere in the state that the ammonium fluorosilicate (AFS) is deposited, the reaction product reacts with moisture in the atmosphere. With an increase of a time during which the substrate is exposed to the atmosphere, a recess (side etch) 110b is formed at a side surface of the silicon nitride film 110, or an expanded foreign substance 110a expanded through a reaction with the moisture is formed on a sidewall of the silicon nitride film 110. Accordingly, damage infliction on the stacked film or closing of the slit may occur, having an adverse effect on a post process and causing a reduction of a yield. To minimize this reduction of the yield, the time during which the substrate is exposed to the atmosphere after the completion of the etching process and before the beginning of a subsequent process needs to be shortened.

In this regard, it is important to remove the ammonium fluorosilicate before the substrate is exposed to the atmosphere. To remove the ammonium fluorosilicate, wet cleaning using pure water and a chemical liquid may be used. To perform the wet cleaning, however, the substrate needs to be exposed to the atmosphere. Thus, in the wet cleaning, the substrate may suffer side etching or generation of an expanded foreign substance, resulting in infliction of a damage on the silicon nitride film 110. Further, since the wet cleaning is performed additionally, a throughput may be reduced.

In contrast, in the substrate processing system 10 according to the present exemplary embodiment, a heat treatment (baking or heating) can be performed after the etching process without needing to expose the substrate W to the atmosphere. Accordingly, the ammonium fluorosilicate can be removed, and a damage on the stacked film can be suppressed. Further, in the substrate processing system 10 according to the present exemplary embodiment, by performing the heat treatment before the etched substrate is transferred into the atmospheric transfer chamber 40 after the completion of the etching process, it is possible to perform the heat treatment without exposing the substrate to the atmosphere after the etching processing. Therefore, the time during which the substrate is exposed to the atmosphere, such as a time taken before the substrate is returned back into the FOUP or a time taken before the subsequent process is begun, need not be managed for the sake of suppressing side etching or generation of an expanded foreign substance. Thus, easy control is enabled.

Further, the present disclosure is not limited to performing the etching processing and the heat treatment in-system in the substrate processing system 10. The etching processing and the heat treatment may be conducted in-situ in a substrate processing apparatus 1 according to the exemplary embodiment shown in FIG. 3. In this substrate processing apparatus 1 as well, the heat treatment can be performed without exposing the substrate to the atmosphere before the etched substrate is transferred into the atmospheric transfer chamber 40 after the etching processing. Thus, the ammonium fluorosilicate can be removed, and the reduction of the yield can be suppressed.

In addition, the processing chamber configured to perform the heat treatment has a heater in the stage, and the substrate is heat-treated while setting the stage to a high temperature. The heat treatment may be performed in at least one of the processing chamber and the load lock chamber having the stage equipped with the heater. The heat treatment may be performed in the vacuum transfer chamber 20 which has a heater in an arm of the transfer device 21 configured to hold the substrate thereon. Further, the substrate W may be heat-treated by infrared heating or radiant heat from a lamp or the like.

[Substrate Processing Apparatus]

Figure 3:
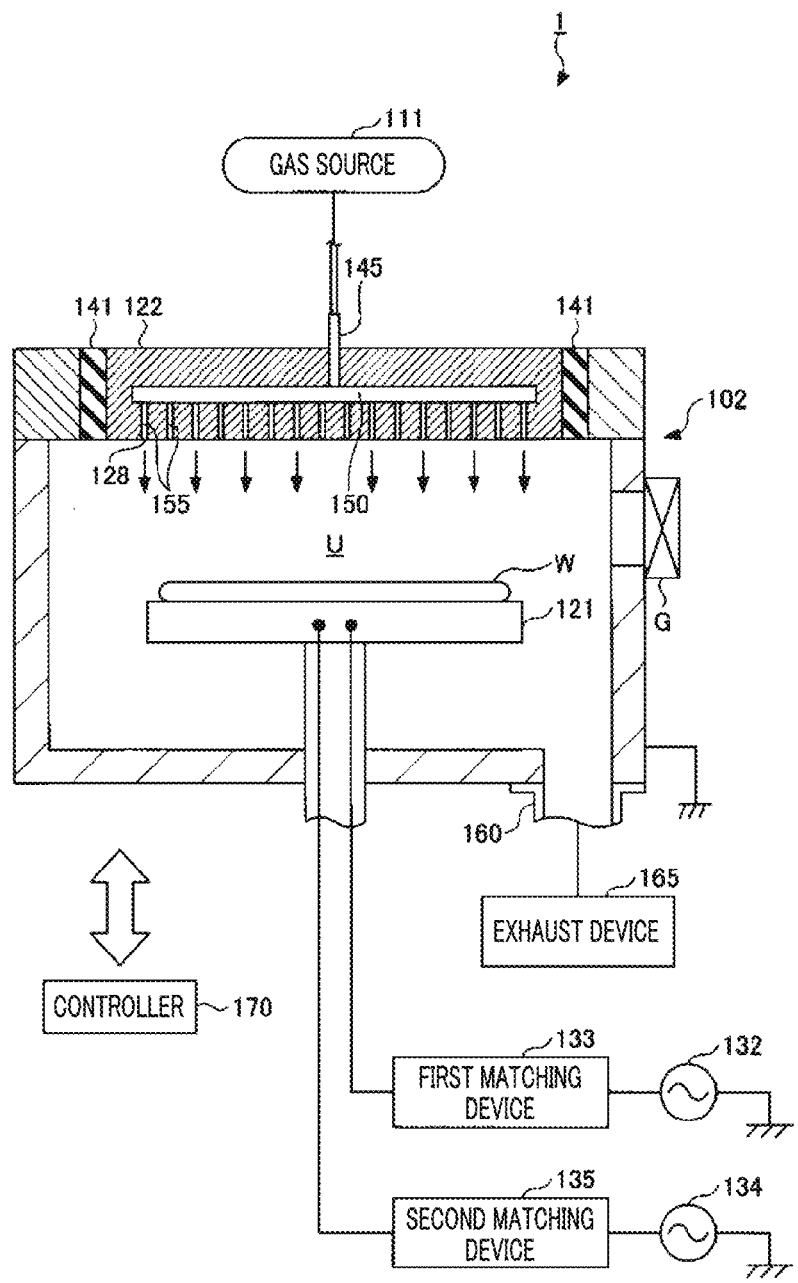
FIG. 3 is a diagram illustrating an example of a substrate processing apparatus according to an exemplary embodiment.

Now, the substrate processing apparatus 1 according to the exemplary embodiment will be described with reference to FIG. 3. FIG. 3 is a diagram illustrating an example of the substrate processing apparatus 1 according to the exemplary embodiment. Here, a capacitively coupled plasma etching apparatus is used as the example of the substrate processing apparatus 1. The substrate processing apparatus 1 corresponds to, among the processing chambers 11 to 14 of the substrate processing system 10, one in which at least one of the etching processing and the heat treatment is conducted.

The substrate processing apparatus 1 includes a processing vessel 102 made of a conductive material such as, but not limited to, aluminum; and a gas source 111 configured to supply a gas into the processing vessel 102. The processing vessel 102 is electrically grounded. The processing vessel 102 has therein a stage 121 and an upper electrode 122 which is disposed to face the stage 121 in parallel. The stage 121 is configured to place the substrate W thereon.

The stage 121 is connected with a first high frequency power supply 132 via a first matching device 133 and a second high frequency power supply 134 via a second matching device 135. The first high frequency power supply 132 applies a high frequency power HF for plasma formation having a frequency ranging from, e.g., 27 MHz to 100 MHz to the stage 121. The second high frequency power supply 134 applies a high frequency power LF for ion attraction having a frequency ranging from, e.g., 400 kHz to 13 MHz lower than the frequency of the first high frequency power supply 132 to the stage 121. Further, the first high frequency power supply 132 may be connected to the upper electrode 122 via the first matching device 133.

The first matching device 133 is configured to match an internal impedance of the first high frequency power supply 132 and a load impedance. The second matching device 135 is configured to match an internal impedance of the second high frequency power supply 134 and the load impedance. When the plasma is formed in a processing space U, the matching devices 133 and 135 serve to control the internal impedances of the first high frequency power supply 132 and the second high frequency power supply 134 to be apparently matched with the load impedance.

The upper electrode 122 is mounted to a ceiling portion of the processing vessel 102 with an insulating member 141 therebetween. The insulating member 141 covers a peripheral portion of the upper electrode 122. The upper electrode 122 is provided with a gas inlet opening 145 through which the gas from the gas source 111 is introduced; and a diffusion space 150 in which the introduced gas is diffused. The gas outputted from the gas source 111 is supplied into the diffusion space 150 through the gas inlet opening 145 and then supplied into the processing space U through gas passages 155 and holes 128. In this way, the upper electrode 122 also serves as a shower head.

An exhaust opening 160 is formed at a bottom surface of the processing vessel 102, and the inside of the processing vessel 102 is exhausted by an exhaust device 165 connected to the exhaust opening 160. Accordingly, the inside of the processing vessel 102 can be maintained at a preset vacuum level. A gate valve G is provided at a sidewall of the processing vessel 102. The gate valve G opens or closes a carry-in/out opening when the substrate W is carried into or out of the processing vessel 102.

The substrate processing apparatus 1 is equipped with a controller 170 configured to control an overall operation of the apparatus. The controller 170 includes a CPU, a ROM, a RAM, and so forth. The ROM stores therein a basic program which is to be executed by the controller 170. The RAM stores therein a recipe. The recipe includes control information upon the substrate processing apparatus 1 for processing conditions (an etching condition and a heat treatment condition). The control information includes a processing time, a pressure (exhaust of the gas), high frequency powers and voltages, flow rates of various kinds of gases, an in-chamber temperature (for example, a set temperature for the substrate), and so forth. Further, the recipe may be stored in a hard disk or a semiconductor memory. Moreover, the recipe may be set to a preset position in a memory area while being stored in a portable computer-readable recording medium such as a CD-ROM or a DVD. The controller 170 controls the preset kinds of gases to be supplied according to a sequence of the recipe stored in the RAM or the like, thus controlling a required processing such as the etching processing upon the substrate W.

[Analysis of Reaction Product]

Figures 4A, 4B:
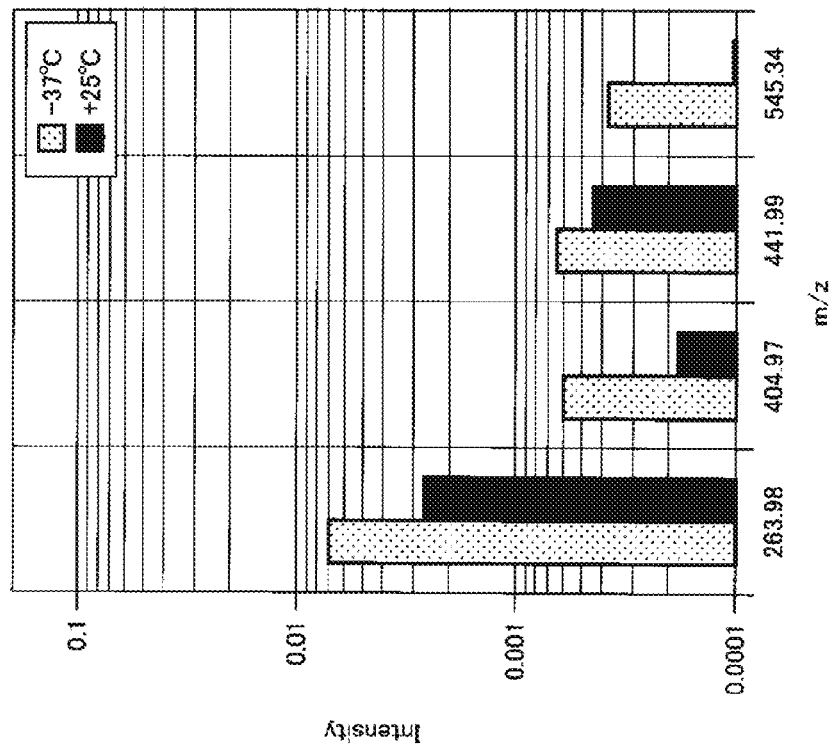
FIG. 4A and FIG. 4B are diagrams illustrating an analysis result of a reaction product generated in the etching process.

FIG. 4A and FIG. 4B are diagrams illustrating an analysis result of the reaction product generated in the etching process and deposited on a sidewall of the slit formed in the silicon nitride film. In the present experiment, a silicon nitride film as an etching target film formed on a substrate in the substrate processing apparatus 1 is etched by using a $CF_4$ gas and a $H_2$ gas, and the substrate is left in the atmosphere for 24 hours. Then, the reaction product on the sidewall of the silicon nitride film is analyzed by TOF (Time of Flight)-SIMS (Secondary Ion Mass Spectroscopy).

FIG. 4A shows a mass spectrum (Intensity) of anions among secondary ions emitted when primary ions are irradiated to the sidewall of the silicon nitride film. As a result of the analysis, it is found out that the reaction product deposited on the sidewall of the silicon nitride film through the etching contains ammonium fluorosilicate $(NH_4)(SiF_5)$ $y^-$ shown in FIG. 4B. Further, as depicted in FIG. 4A, in comparison of two cases where a temperature of the substrate is controlled to −37° C. and to 25° C. when the silicon nitride film is etched, a larger amount of ammonium fluorosilicate is generated when the substrate is etched at the lower temperature of −37° C.

That is, as can be seen from the above experiment, if the silicon nitride film is etched by using plasma of the gas containing hydrogen and fluorine, the reaction product including the ammonium fluorosilicate is deposited on a front surface and the side surface of the silicon nitride film. If the substrate is exposed to the atmosphere afterwards, the reaction product reacts with moisture in the atmosphere or the like, resulting in side etching of the silicon nitride film or generation of an expanded foreign substance. As a result, the post process may be impeded. Thus, it is desirable to remove the ammonium fluorosilicate by heat-treating the substrate in-System after the silicon nitride film is etched.

[Substrate Processing Method]

FIG. 5 is a flowchart illustrating an example of a substrate processing method according to the exemplary embodiment. If the present processing is begun, a substrate is transferred into one of the processing chambers 11 to 14, which is configured to perform an etching processing, to be ready for the processing (process S1). An etching target film formed on the substrate needs to be a silicon-containing film. By way of example, the etching target film may be a silicon nitride film, a silicon oxide film, or a stacked film including the silicon oxide film and the silicon nitride film.

Then, by supplying a CF-based etching gas, the etching target film is etched by plasma of the CF-based etching gas (process S2). Etching conditions are specified as follows.

(Etching Conditions)
Gas kinds: $C_4F_8$, $H_2$, Ar
Pressure: 10 mT to 100 mT (1.33 Pa to 13.3 Pa)
Stage temperature (substrate temperature): −60° C. to 0° C.
High frequency power HF: On After the etching target film on the substrate is etched under the aforementioned etching conditions, the substrate is transferred into one of the processing chambers 11 to 14, which is configured to conduct an aching processing in-system (process S3). Then, the stage temperature of the processing chamber into which the substrate is transferred is set to be a high temperature, and the substrate is heat-treated (baked) (process S4). Then, the present processing is completed. Baking conditions are specified as follows.

(Baking Conditions)
Gas kinds: a $N_2$ gas or an Ar gas
Pressure: 1 T to 100 T (133 Pa to 13300 Pa)

Further, when the heat treatment is performed as shown in FIG. 3, the temperature of the stage 121 which performs the heat treatment is higher than a temperature for heating and decomposing the reaction product of ammonium fluorocsilicate. Meanwhile, the temperature of the stage 12 is set to be lower than the lowest temperature among a temperature at which the etching target film on the substrate is thermally deformed, a temperature at which the mask is thermally deformed, and a temperature at which a bevel deposit, which is generated in the etching process and attached at a bevel portion of the substrate, is thermally deformed.

The bevel portion refers to a region of a rear surface of the substrate W at a R portion (edge portion) outer than a flat portion thereof, and a bevel deposit refers to a reaction product of a CF polymer containing carbon and fluorine attached to the bevel portion.

For example, FIG. 6 is a diagram illustrating an example of degeneration or deformation temperatures of various materials. Degeneration or deformation temperatures of the bevel deposit, a resist (G-ray), an organic film, single crystalline silicon, silicon oxide and silicon nitride are about 250° C., about 120° C., about 500° C., about 1414° C., about 1710° C., about 1900° C., respectively.

In the substrate processing method according to the present exemplary embodiment, the baking is performed at a temperature equal to or higher than a temperature at which the ammonium fluorosilicate is decomposed and equal to or lower than a temperature at which the bevel deposit generated during the etching is not peeled off. By way of example, if the temperature at which the ammonium fluorosilicate is decomposed is equal to or higher than 120° C. and the temperature at which the bevel deposit is not peeled off is less than 250° C., the substrate is heated while controlling the stage temperature to be equal to or higher than 120° C. and less than 250° C. If, however, another film on the substrate is degenerated at a temperature lower than the temperature at which the bevel deposit is not peeled off, the stage temperature is controlled to be of a value at which all films on the substrate including that film are not degenerated. For example, if a wiring layer is deformed at the lowest temperature, the stage temperature is controlled to be of a value lower than the temperature at which the wiring layer is deformed.

EXAMPLES

Figure 7:
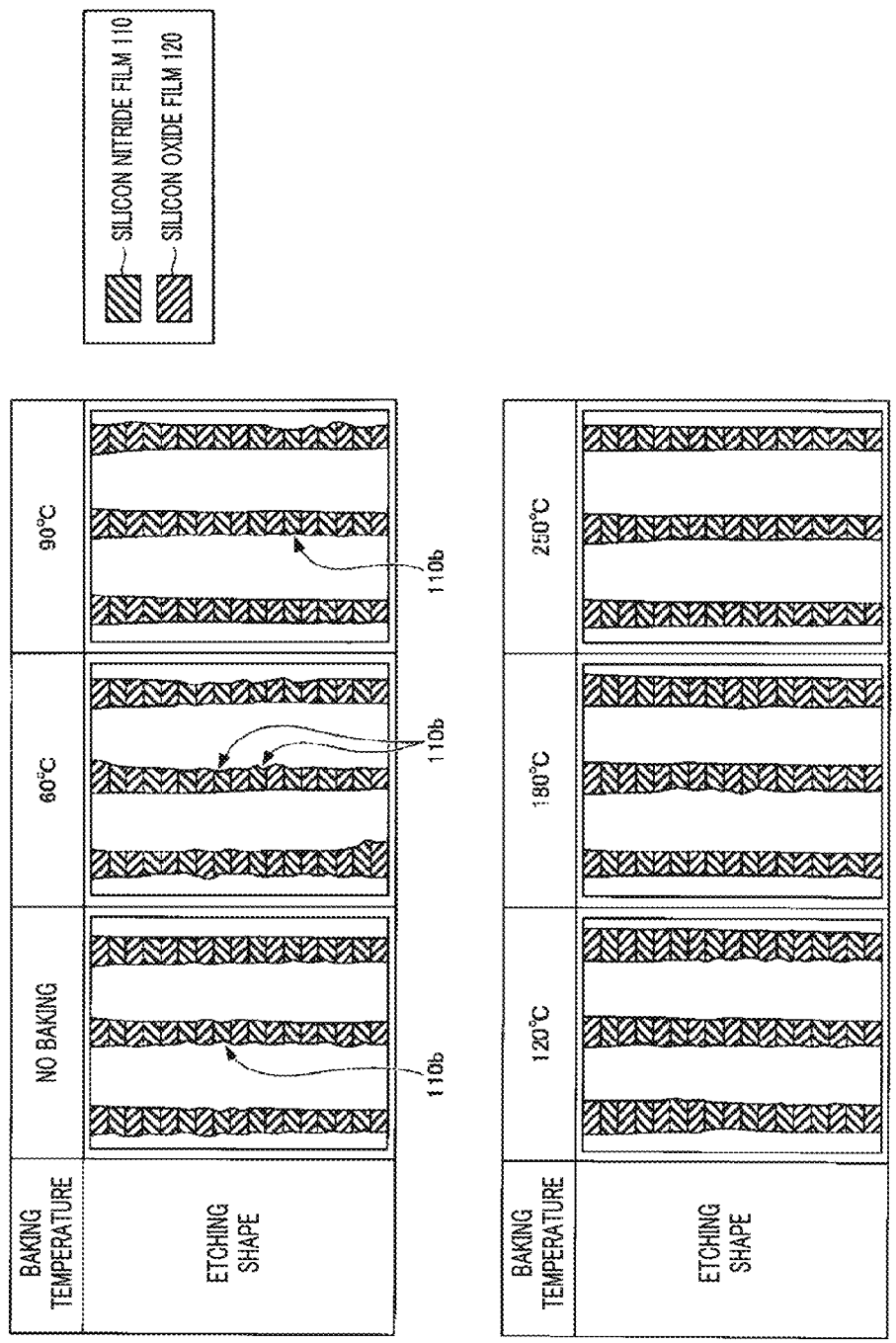
FIG. 7 is a diagram illustrating an example of the etching target film after a heat treatment process according to the exemplary embodiment.
Figure 8:
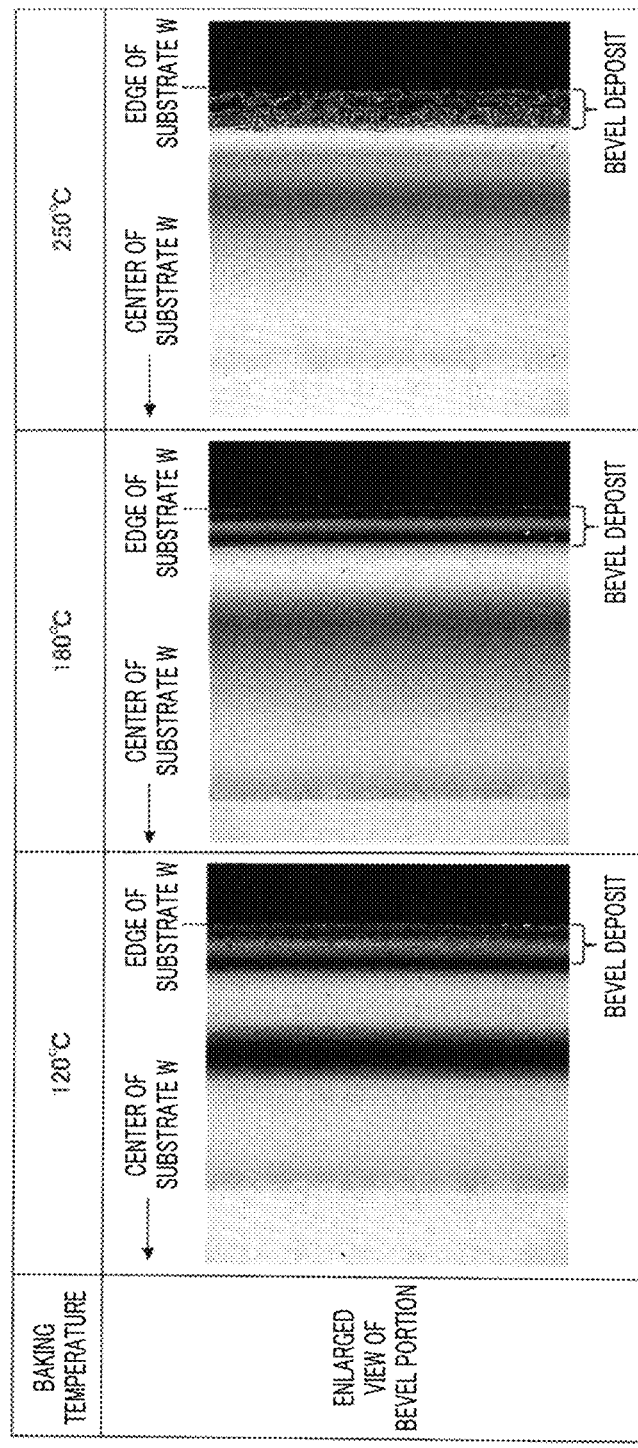
FIG. 8 is a diagram illustrating an example of the reaction product deposited at a bevel portion of a substrate according to the exemplary embodiment.

Now, as an example, an experiment result of the heat treatment performed after the etching processing in the above-described substrate processing method will be explained with reference to FIG. 7 and FIG. 8. FIG. 7 is a diagram illustrating an example of an observation result of the etching target film after the heat treatment process according to the exemplary embodiment. FIG. 8 is a diagram illustrating an example of an observation result of the bevel deposit attached to the bevel portion R of the substrate shown in FIG. 7.

The etching target film shown in FIG. 7 is the stacked film of the silicon nitride films 110 and the silicon oxide films 120. The etching conditions and the baking conditions are the same as specified above. FIG. 7 depicts a part of a cross section of the slit shape formed in the stacked film by the etching, and shows an observation result of an etching shape after a lapse of 24 hours from the etching processing. FIG. 7 shows, in sequence from the upper left side, a case where the substrate is not baked after the etching processing and cases where the substrate is baked at temperatures of 60° C., 90° C., 120° C., 180° C., 250° C. after the etching processing. As can be seen from this result, when the substrate is not baked after the etching processing and when the substrate is baked at the temperatures of 60° C. and 90° C. after the etching processing, side etching of the silicon nitride film 110 has occurred. On the contrary, when the substrate is baked at the temperatures of 120° C., 180° C. and 250° C., side etching has not occurred and no expanded foreign substance has been found at the silicon nitride film 110. Further, regardless of whether the baking is performed or not, the silicon oxide film 120 has suffered neither side etching nor generation of an expanded foreign substance.

FIG. 8 illustrates the example observation result of the bevel deposit attached to the bevel portion R of the rear surface of the substrate shown in FIG. 7. When the temperature of the stage on which the substrate is placed is 120° C. and 180° C., the bevel deposit adhering to the bevel portion R has not been peeled off. Meanwhile, when the temperature of the stage is 250° C., the bevel deposit adhering to the bevel portion R has been peeled off.

As can be seen from the above, it is found out based on the experiment result that the temperature at which the ammonium fluorosilicate is decomposed is equal to or higher than 120° C. at which side etching and generation of an expanded foreign substance have not occurred. Further, the temperature at which the bevel portion is not peeled off is found to be less than 250° C. Thus, in the heat treatment process after the etching process, the substrate is heated while controlling the stage temperature to be equal to or higher than 120° C. and less than 250° C. As a result, the ammonium fluorosilicate deposited on the sidewall or the like of the etching target film can be removed without causing the bevel deposit from being peeled off the bevel portion. Therefore, the etching target film can be suppressed from being damaged by the ammonium fluorosilicate included in the reaction product containing silicon, nitrogen and fluorine which is deposited on the etching target film.

[Cleaning Apparatus]

Figure 9:
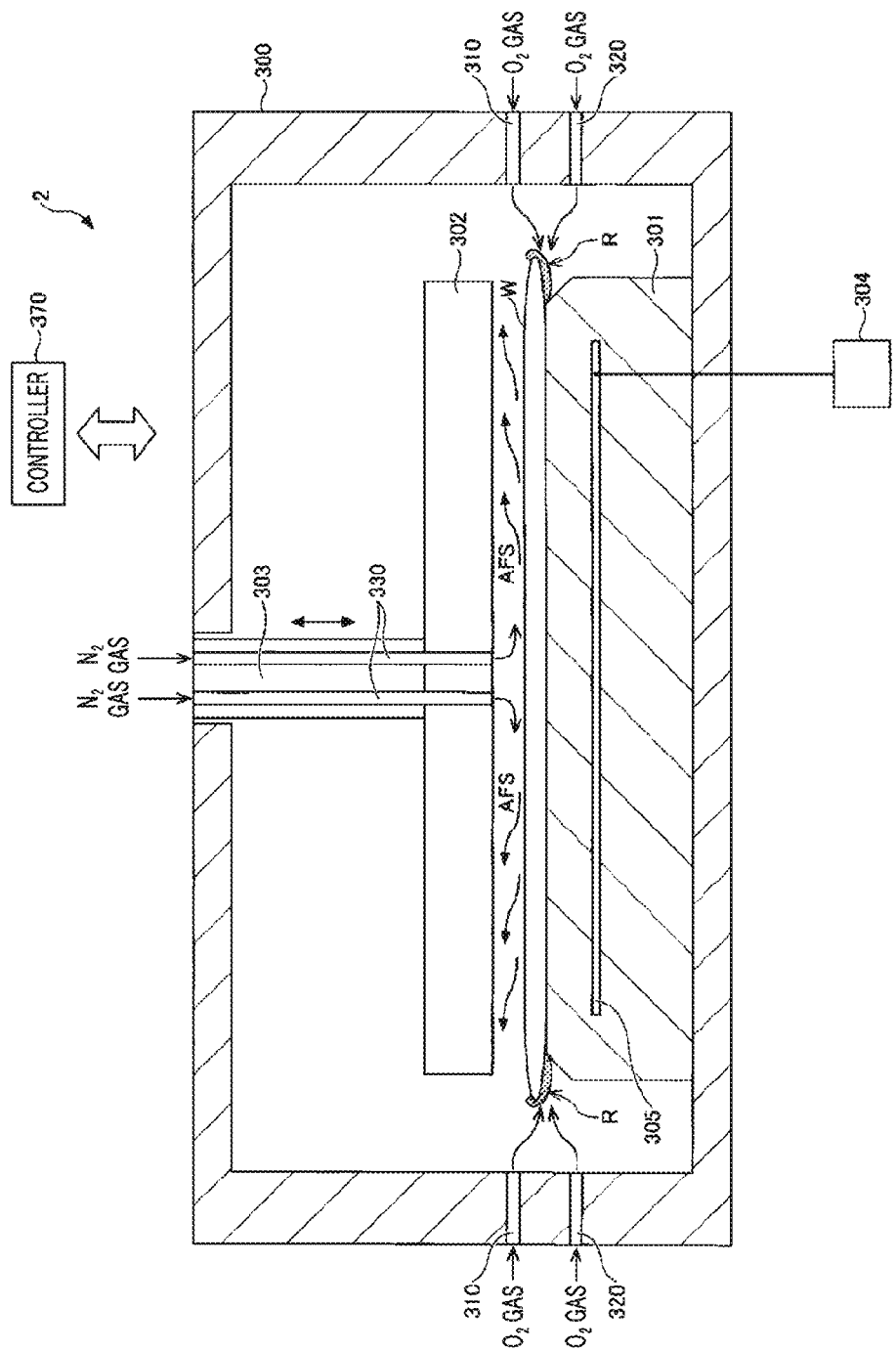
FIG. 9 is a diagram illustrating an example of a cleaning apparatus according to the exemplary embodiment.

Now, referring to FIG. 9, a cleaning apparatus 2 according to the exemplary embodiment will be explained. FIG. 9 is a diagram illustrating the cleaning apparatus 2 according to the exemplary embodiment.

The cleaning apparatus 2 includes a processing vessel 300, a stage 301 (stage) configured to place the substrate W thereon, an upper electrode 302 disposed to face the stage 301, and a supporting member 303 configured to lift up the upper electrode 302. The processing vessel 300 is provided with a non-illustrated transfer port through which the substrate W is carried in or out; and a non-illustrated gate valve configured to open or close the transfer port.

The supporting member 303 penetrates the processing vessel 300 and is connected to a non-illustrated driving unit. By moving the supporting member 303 vertically by the driving unit, the upper electrode 302 is moved up and down. A gap between a wall of the processing vessel 300 and the supporting member 303 is sealed to create a vacuum therein by a non-illustrated bellows at an outside of the processing vessel 300. The supporting member 303 has gas supply 330 and supplies an inert gas such as a $N_2$ gas toward a center of the substrate W from the gas supply 330. An upper gas supply 310 and a lower gas supply 320 are formed through a sidewall of the processing vessel 300. An $O_2$ gas as an example of a cleaning gas is supplied to the vicinity of a peripheral portion of the substrate W on the stage 301 from a transversal direction through the upper gas supply 310 and the lower gas supply 320.

The substrate W having the etching target film etched according to a pattern of the mask is placed on the stage 301. A high frequency power for plasma formation is applied to the stage 301 from a non-illustrated high frequency power supply. Accordingly, plasma of the $O_2$ gas is formed near the peripheral portion of the substrate W. At this time, by setting a space between the stage 301 and the upper electrode 302 to be narrower than a sheath width of the plasma, the plasma is not formed in this space. Accordingly, the plasma of the $O_2$ gas is formed near the peripheral portion of the substrate W, and the bevel deposit adhering to the bevel portion R of the substrate W is ached by this oxygen plasma. Further, the high frequency power from the high frequency power supply may be applied to the upper electrode 302.

The stage 301 is equipped with a heater 305 embedded therein. By applying an AC voltage to the heater 305 from an AC power supply 304, the substrate on the stage 301 is heated to a preset temperature. A controller 370 controls a temperature of the stage 301 to 120° C. or higher. Accordingly, the ammonium fluorosilicate generated by the etching and deposited on the etching target film is decomposed by heat. The decomposed ammonium fluorosilicate is purged toward the peripheral portion of the substrate from the center thereof by the $N_2$ gas supplied from the gas supply 330, and is pushed to a peripheral side of the substrate W and exhausted to the outside by a non-illustrated exhaust device.

As stated above, according to the cleaning apparatus 2 having the above-described configuration, the ammonium fluorosilicate deposited on the etching target film of the substrate W is decomposed by heat-treating it at 120° C. or higher, while ashing the bevel deposit attached to the bevel portion R of the substrate W by oxygen plasma. Accordingly, the removal of the bevel deposit and the removal of the ammonium fluorosilicate can be carried out at the same time.

Further, the temperature of the stage 301 is set to be higher than the temperature at which the ammonium fluorosilicate deposited on the etching target film is decomposed by being heated and lower than the temperature at which the etching target film is thermally deformed or the temperature at which the mask is thermally deformed, whichever is lower. Meanwhile, the temperature of the stage 301 is set to be higher than the temperature at which the bevel deposit can be removed. Accordingly, it is possible to remove the ammonium fluorosilicate and the bevel deposit while avoiding thermal deformation of the etching target film and the mask.

In the above-described exemplary embodiment, the etching is performed by using the silicon containing film containing N as the etching target film. However, the exemplary embodiment is not limited thereto. By way of example, when the etching is performed by using a silicon containing film without containing N as an etching target film, a gas containing N and H may be used as the etching gas in addition to the CF-based gas.

Furthermore, in the exemplary embodiment, the reaction product deposited on the etching target film contains the ammonium fluorosilicate. However, the reaction product is not limited thereto. By way of example, if the etching target film is etched in an environment in which nitrogen (N), hydrogen (H) and halogen exist, a reaction product containing ammonium halide may be deposited on the etching target film. As an example, the halogen may be fluorine (F), chlorine (CI), bromine (Br), or iodine (I). As an example, the ammonium halide may be ammonium fluoride, ammonium chloride, ammonium bromide, or ammonium iodide. If the substrate is exposed to the atmosphere in the state that the reaction production containing the ammonium halide is deposited, the reaction product may react with moisture in the atmosphere, resulting in side etching of the silicon nitride film and generation of an expanded foreign substance, which may impede a post process. Further, as in the above-described exemplary embodiment, by setting the temperature of the stage 301 to be higher than a temperature at which the ammonium halide is decomposed by heating, side etching and generation of an expanded foreign substance can be suppressed.

It should be noted that the substrate processing method, the substrate processing apparatus and the cleaning apparatus according to the above-described exemplary embodiments are illustrative in all aspects and are not anyway limiting. The above-described exemplary embodiments may be modified and improved in various ways without departing from the scope and the spirit of claims. Unless contradictory, the disclosures in the various exemplary embodiments can be combined appropriately.

The substrate processing apparatus of the present disclosure may be applicable to any of various kinds of apparatuses such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, a helicon wave plasma (HWP) apparatus.

According to the exemplary embodiment, it is possible to suppress the etching target film from being damaged by the reaction product deposited thereon.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
preparing a substrate including an etching target film and a mask;
etching the etching target film through the mask by plasma;
after the etching, ashing a deposit adhering to a bevel of the substrate; and
heat-treating the substrate at a preset temperature after the etching of the etching target film,
wherein in the etching of the etching target film, a temperature of the substrate is set to be in a range of −60° C. or higher and lower than 0° C.,
wherein in the etching of the etching target film, an ammonium fluorosilicate (AFS) is formed;
wherein the ashing of the deposit and the heat-treating of the substrate are performed simultaneously,
wherein the etching of the etching target film and the heat-treating of the substrate are performed without exposing the substrate to atmosphere,
wherein a chamber in which the heat-treating of the substrate is performed is different from a chamber in which the etching of the etching target film is performed.

2. The substrate processing method of claim 1,
wherein the etching of the etching target film comprises etching the etching target film in an environment in which nitrogen (N), hydrogen (H) and fluorine (F) exist when the etching target film contains silicon (Si).

3. The substrate processing method of claim 1,
wherein the etching target film contains silicon nitride (SiN),
wherein the etching of the etching target film comprises etching the etching target film in an environment in which hydrogen (H) and fluorine (F) exist when the etching target film contains silicon nitride (SiN).

4. The substrate processing method of claim 1,
wherein the heat-treating of the substrate comprises removing a reaction product deposited on the etching target film, the reaction product being generated in the etching of the etching target film and containing nitrogen (N), hydrogen (H) and halogen, and
a temperature of a stage configured to place the substrate thereon in the heat-treating of the substrate is higher than a temperature at which the reaction product is decomposed by heating, and is set to be lower than a lowest temperature among a temperature at which the etching target film is deformed or degenerated by heat, a temperature at which the mask is deformed or degenerated by heat, and a temperature at which a reaction product containing carbon (C) and fluorine (F) generated in the etching of the etching target film is deformed or degenerated by heat.

5. The substrate processing method of claim 4,
wherein the reaction product deposited on the etching target film contains at least one of ammonium fluoride, ammonium chloride, ammonium bromide, or ammonium iodide.

6. The substrate processing method of claim 1,
wherein, in the heat-treating of the substrate, a temperature of the substrate is controlled to be equal to or higher than 120° C. and less than 250° C.

7. The substrate processing method of claim 1,
wherein, in the heat-treating of the substrate, a pressure within a chamber is controlled to be equal to or higher than 133 Pa and equal to or less than 13,300 Pa.

8. The substrate processing method of claim 1,
wherein the etching target film includes at least one selected from the group consisting of a silicon nitride film, a silicon oxide film, or a stacked film of a silicon oxide film and a silicon nitride film.

9. The substrate processing method of claim 1,
wherein the heat-treating of the substrate is performed by using plasma.

10. The substrate processing method of claim 9,
wherein the plasma used in the heat-treating of the substrate is generated from an oxygen gas.

11. The substrate processing method of claim 1,
wherein, in the etching of the etching target film, at least one gas selected from the group consisting of a fluorocarbon gas, a hydrofluorocarbon gas and a gas including nitrogen and hydrogen is used.

12. A substrate processing method performed in a system, the system comprising:

a first chamber;
a second chamber different from the first chamber; and
a vacuum transfer chamber connected to the first chamber and to the second chamber,
the substrate processing method comprising:
providing a substrate including an etching target film and a mask on the etching target film in the first chamber;
forming a first plasma to etch the etching target film through the mask by the first plasma, wherein an ammonium fluorosilicate (AFS) is formed in the etching;
transferring the substrate from the first chamber to the second chamber through the vacuum transfer chamber;
forming a second plasma from oxygen-containing gas to ash a deposit adhering to a bevel of the substrate; and
heating the substrate to remove the AFS;
wherein the forming of the second plasma and the heating of the substrate are performed simultaneously.

13. The substrate processing method of claim 12, wherein, in the etching of the etching target film, a temperature of the substrate is in a range of −60° C. or higher and lower than 0° C.

14. The substrate processing method of claim 12, wherein, in the heat-treating of the substrate, a temperature of the substrate is in a range of 120° C. or higher and lower than 250° C.

* * * * *

UNITED STATES PATENT AND TRADEMARK OFFICE
CERTIFICATE OF CORRECTION

PATENT NO. : 11,631,590 B2
APPLICATION NO. : 16/944546
DATED : April 18, 2023
INVENTOR(S) : Muneyuki Omi et al.

Page 1 of 1

It is certified that error appears in the above-identified patent and that said Letters Patent is hereby corrected as shown below:

In the Specification

Column 8, Line 1, "aching" should be -- ashing --.

Column 10, Line 19, "ached" should be -- ashed --.

Signed and Sealed this
Thirtieth Day of January, 2024

Katherine Kelly Vidal
*Director of the United States Patent and Trademark Office*